United States Patent
Dupe et al.

(10) Patent No.: US 10,136,531 B2
(45) Date of Patent: *Nov. 20, 2018

(54) MEASUREMENT DEVICE WITH SINGLE CONTROL CIRCUIT

(71) Applicant: Airbus Operations S.A.S., Toulouse (FR)

(72) Inventors: Nicolas Dupe, Cornebarrieu (FR); Olivier Sornique, Colomiers (FR); Gilles Studer, Fonsorbes (FR)

(73) Assignee: Airbus Operations S.A.S. (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/105,843

(22) PCT Filed: Dec. 19, 2014

(86) PCT No.: PCT/EP2014/078828
§ 371 (c)(1),
(2) Date: Jun. 17, 2016

(87) PCT Pub. No.: WO2015/091996
PCT Pub. Date: Jun. 25, 2015

(65) Prior Publication Data
US 2017/0079152 A1    Mar. 16, 2017

(30) Foreign Application Priority Data
Dec. 19, 2013 (FR) ...................................... 1363052

(51) Int. Cl.
*H05K 1/00* (2006.01)
*H05K 5/02* (2006.01)
(Continued)

(52) U.S. Cl.
CPC ........... *H05K 5/0217* (2013.01); *G01D 11/30* (2013.01); *G01L 19/147* (2013.01);
(Continued)

(58) Field of Classification Search
USPC ......................................... 361/749, 748, 750
See application file for complete search history.

(56) References Cited

U.S. PATENT DOCUMENTS 2,792,185 A    5/1957  Juliard
4,578,735 A    3/1986  Knecht et al.
(Continued)

FOREIGN PATENT DOCUMENTS

CN    85108071 A    4/1986
CN    1223720 A     7/1999
(Continued)

OTHER PUBLICATIONS

International Search Report PCT/EP2014/078828 (dated Apr. 8, 2015).
(Continued)

*Primary Examiner* — Andargie M Aychillhum
(74) *Attorney, Agent, or Firm* — Lerner, David, Littenberg, Krumholz & Mentlik, LLP

(57) ABSTRACT

A measurement device can be attached to an outer wall of a movable object or of a stationary object arranged in a flow of air in order to measure physical quantities. The measurement device includes a mounting which has recesses having an opening leading to the outside in which sensors are provided. The mounting comprises a cavity in which a flexible printed circuit is housed, on which a single circuit for controlling the sensors is provided. The device has multiple advantages, in particular that of providing a simple measurement device which offers a system for control and interconnection of sensors that is accessible and less complex while offering numerous advantages.

16 Claims, 4 Drawing Sheets

(51) Int. Cl.
  *G01D 11/30* (2006.01)
  *G01L 19/14* (2006.01)
  *H05K 1/02* (2006.01)
  *H05K 1/18* (2006.01)
  *G01M 9/06* (2006.01)

(52) U.S. Cl.
  CPC ............ *G01L 19/148* (2013.01); *H05K 1/028* (2013.01); *H05K 1/18* (2013.01); *G01M 9/06* (2013.01); *H05K 2201/10151* (2013.01)

(56) References Cited

U.S. PATENT DOCUMENTS

| | | | |
|---|---|---|---|
| 4,592,229 A | 6/1986 | Butefisch et al. | |
| 4,995,401 A | 2/1991 | Bunegin et al. | |
| 5,644,285 A | 7/1997 | Maurer | |
| 5,874,671 A | 2/1999 | Lopez | |
| 5,891,751 A | 4/1999 | Kurtz et al. | |
| 6,134,485 A | 10/2000 | Tanielian et al. | |
| 6,382,738 B1* | 5/2002 | Bayer | B60T 8/3675 303/119.2 |
| 6,662,647 B2 | 12/2003 | Schoess et al. | |
| 9,116,024 B2 | 8/2015 | Laurent | |
| 2006/0202086 A1 | 9/2006 | Paradis et al. | |
| 2006/0244702 A1* | 11/2006 | Yamazaki | H01L 27/3269 345/89 |
| 2008/0175759 A1 | 7/2008 | Oishi et al. | |
| 2011/0107829 A1 | 5/2011 | Wood et al. | |
| 2013/0199302 A1 | 8/2013 | Gardner et al. | |
| 2013/0221468 A1* | 8/2013 | Bolognia | H01L 31/024 257/433 |
| 2016/0229166 A1 | 8/2016 | Tanaka et al. | |

FOREIGN PATENT DOCUMENTS

| | | |
|---|---|---|
| EP | 2562517 A1 | 2/2013 |
| FR | 2 953 287 A1 | 6/2011 |
| JP | 2006202086 A | 8/2006 |
| WO | 99/50115 A1 | 10/1999 |
| WO | 2006/053386 A1 | 5/2006 |
| WO | 2007/107522 A1 | 9/2007 |
| WO | 2008/053193 A1 | 5/2008 |

OTHER PUBLICATIONS

International Search Report PCT/EP2014/078822 (dated Mar. 17, 2015).
International Search Report PCT/EP2014/078818 (dated Apr. 8, 2015).
U.S. Appl. No. 15/105,933, filed Jun. 17, 2016.
U.S. Appl. No. 15/105,972, filed Jun. 17, 2016.

* cited by examiner

MEASUREMENT DEVICE WITH SINGLE CONTROL CIRCUIT

CROSS-REFERENCE TO RELATED APPLICATIONS

The present application is a national phase entry under 35 U.S.C. § 371 of International Application No. PCT/EP2014/078828, filed Dec. 19, 2014, published in French, which claims priority from French Patent Application No. 1363052 filed Dec. 19, 2013, the entire disclosures of which are hereby incorporated herein by reference.

The present invention relates to a measurement device likely to be attached to an outer wall of a moving object or of a fixed object located in a flow of air to measure physical quantities. More specifically, the present invention applies to the measurement of parameters used to characterize a flow of air on the surface of an aircraft.

TECHNICAL FIELD

During in-flight tests, sensors are mounted on the outer surface of an aircraft to perform different types of measurement. The study of the results makes it possible to understand the behavior of an aircraft in flight and to improve or validate the performance levels thereof. According to a particular application, it is possible for example to detect and locate aerodynamic phenomena on the aircraft.

PRIOR ART

Patent FR2953287 filed by MC ACI on 27 Nov. 2009 discloses a device for conducting measurements in the vicinity of a wall. The device comprises a polymer plate of small thickness that can be fixed onto said wall. The polymer plate comprises cavities capable of receiving sensors and electrical wires leading into said cavities.

Each cavity comprises two recesses separated by a flange: the first recess receives the sensor and the second recess the electrical connection means between the sensor and the electrical wires. According to a particular embodiment, a third recess is provided to receive an electronic circuit called "measurement circuit", necessary to the operation of the associated sensor.

The form of the device is therefore complex in view of the number of recesses needed for all the sensors, electrical wires and measurement circuits.

Furthermore, it is necessary to solder the end of the electrical wires to other electrical conductors, to coat them with a copper shielding, to associate them with a support plate and to embed them in a polymer plate. The result is a complicated system of interconnections in which it is difficult, even impossible, to intervene in case of failure of the type, for example, of breakage of an electrical wire.

The aim of the present invention is therefore to mitigate all these drawbacks and to propose a simple measurement device that offers a control and interconnection system for the sensors that is accessible and less complex.

SUMMARY OF THE INVENTION

In order to do this, the present invention proposes a measurement device comprising a support having recesses provided with an opening leading toward the outside in which sensors are provided, characterized in that the support comprises a cavity in which a flexible printed circuit is housed at which a single control circuit is provided for the sensors.

In this way, the present invention, by providing a single control circuit, offers numerous advantages: lighter weight, lower consumption, less complex data communication, a less bulky system, a limitation of the points of rigidity in a curved zone because of its small surface area for increased longevity.

The invention provides at least one of the following optional features, taken in isolation or in combination.

The circuit is crossed by tracks joining the linking ends of the circuit.

The sensors are positioned on a same row or a number of rows offset relative to the tracks.

Tracks are provided to link each of the sensors to the control circuit.

The circuit comprises at least two printed circuit layers separated by an insulating layer.

The tracks which cross the circuit and the tracks provided to link the sensors to the control circuit are located on one or other of the printed circuit layers.

One of the tracks is reserved for supplying power to the sensor.

The present invention relates also to the measurement system comprising at least one measurement device having the above features. The system comprises a central power supply and acquisition unit connected to the flexible printed circuit of said measurement device, said unit comprising a control circuit for all the control circuits of the measurement devices.

The measurement system comprises means for supplying power to all the measurement devices via a track of the circuit.

BRIEF DESCRIPTION OF THE DRAWINGS

Other aims, advantages and features of the invention will become apparent on reading the following description of the device according to the invention, given as a nonlimiting example with reference to the attached drawings in which.

HOW TO PRODUCE THE INVENTION

Figure 1:
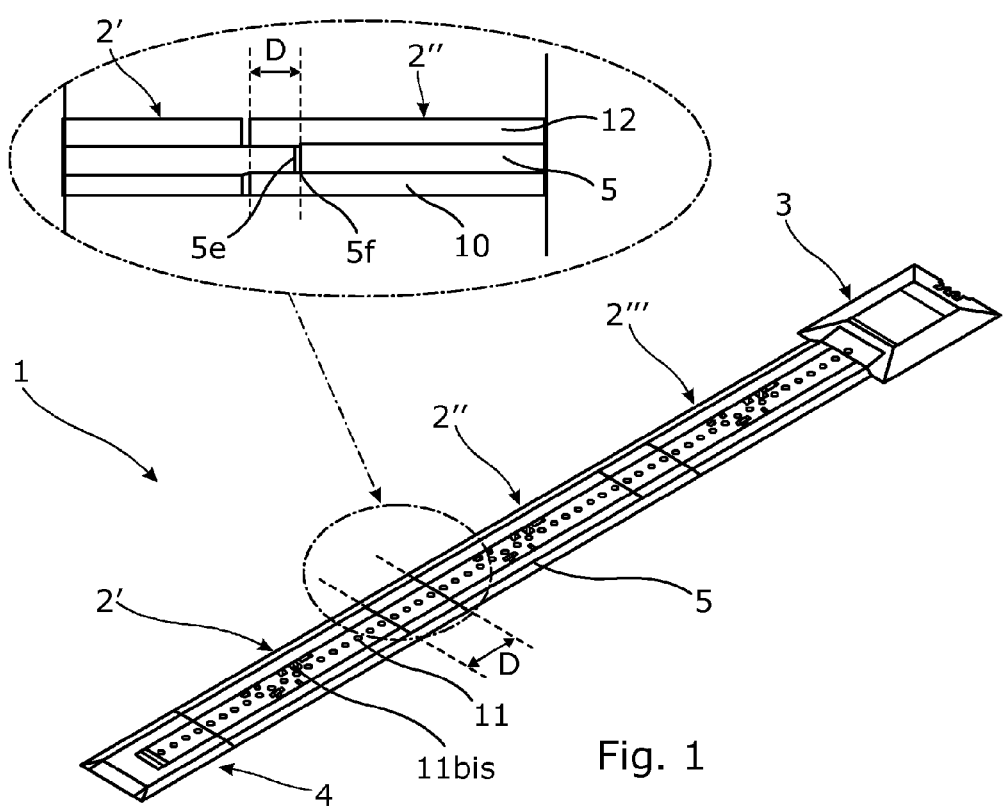
FIG. 1 represents a perspective and partially transparent schematic view of an embodiment of the overall measurement system comprising the measurement device according to the present invention in which the junction between two measurement devices is represented schematically in enlarged and partially simplified longitudinal cross section.

According to an illustrative application represented in FIG. 1, the measurement system 1 according to the present invention equips a determined zone of an aircraft. The system 1 has at least three parts 2, 3 and 4. The first part 2 that forms the object of the present patent application consists of a device 2 for measuring different physical quantities that can be attached to a wall on the outside of the aircraft and, for example, on the outer wall of the wings of the aircraft. A measurement system 1 can comprise one or more measurement devices 2 designated in FIG. 1 by the references 2', 2'', 2''', the measurement devices 2 being linked in such a way as to form a device chain making it possible to perform measurements over an extended surface. The second part 3 consists of a central unit 3 for supplying power to and acquiring signals from said measurement device or devices 2. The power supply and acquisition unit 3 is situated either in contact with a measurement device or at a distance therefrom. The part 4 consists of a device which, like the part 2, can also perform measurements. However, it does not have all the characteristics of a measurement device 2 notably because it is placed at the chain end. The part 4 terminates the chain of measurement devices 2 and will consequently be hereinafter called end device 4.

Figure 2:
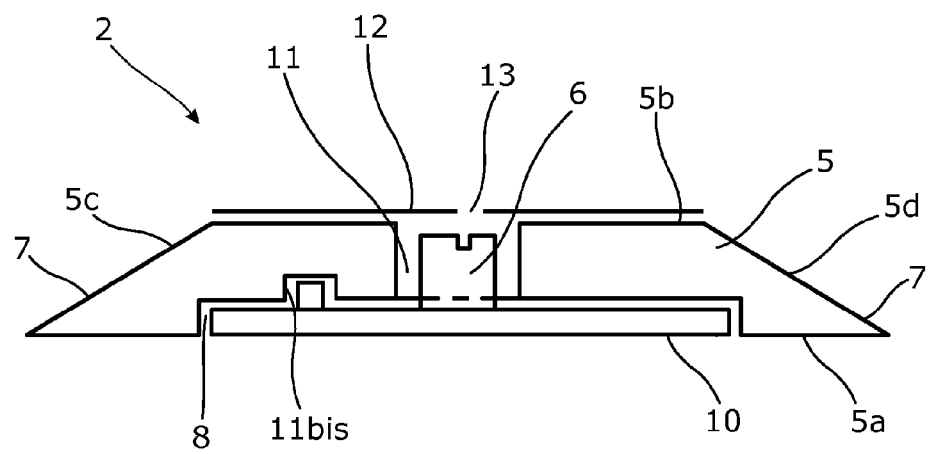
FIG. 2 represents a schematic view in cross section of the measurement device according to the embodiment represented in FIG. 1.
Figure 3:
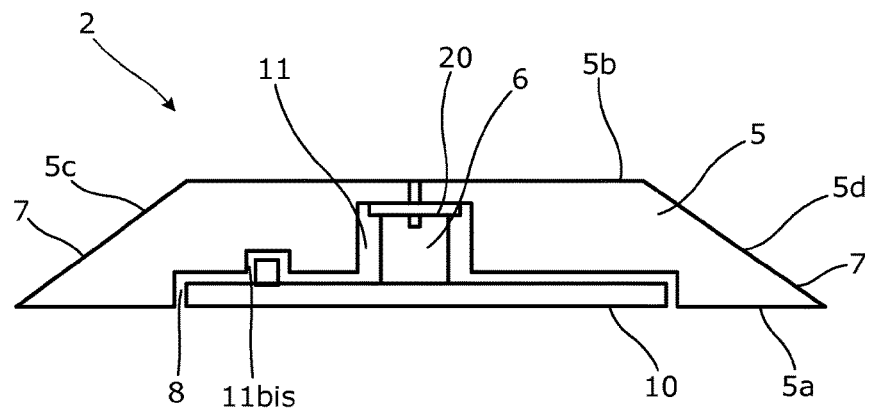
FIG. 3 represents a schematic view in cross section of another embodiment of said device according to the present invention.

The measurement device 2 represented in FIGS. 1 and 2 takes the form of a flexible support 5 for sensors 6 making it possible to follow the contours of the aircraft. Each sensor is capable of measuring physical quantities such as, in an illustrative and nonlimiting manner pressure, temperature, acceleration, mechanical loads, etc. The sensors can be grouped together in units making it possible to measure a number of quantities and, for example, in a micro-electromechanical system, called MEMS. The multi-quantity measurement units of MEMS type will hereinafter be called sensor 6. The function of the support 5 is to offer a fairing for the sensors that do not consequently need any particular jacket and to keep the sensors as close as possible to the wall on which the measurement device is arranged to perform the measurements. The support can be produced in polymer material, for example in polyurethane or flexible silicone, to follow the contours of the aircraft. It can be produced by molding, machining, or any other known manufacturing method.

The support 5 can take any kind of form. In the example illustrated, the support takes a parallelepipedal longilinear form of trapezoidal cross section. As indicated, the support 5 can take any other form and need not be longilinear, nor even parallelepipedal. The sensors 6 are housed in the central part of the support of greatest thickness. The support 5 has six faces:

a first face 5a intended to come into contact with the wall of the aircraft;

a free second face 5b, parallel to and opposite the face 5a;

two faces 5c, 5d forming the edges 7 of the support 5. The edges 7 of the support 5 have a decreasing thickness making it possible to provide a surface that very weakly disturbs the aerodynamic flow;

two faces 5e, 5f not represented in the figures, of trapezoidal form forming the ends of the support, one of them being intended to be connected to the links provided to the power supply and acquisition unit 3 or to another measurement device 2 and the other being intended to be connected to another measurement device 2 or to an end device 4. According to one possible embodiment, the faces 5e and 5f are mutually parallel; the faces 5e and 5f are also orthogonal to the faces 5a and 5b. In this way, the measurement devices can be attached by their faces 5e and 5f to form an overall uniform and continuous support 5. As indicated above, the support 5 can take any kind of form: thus, the faces 5e and 5f may not be planar but chamfered or even, for example, have a complex form. The form of the face respectively 5e, 5f should be such that it fits into the form of the face respectively 5f, 5e of the support 5 of the adjacent measurement device so as to form a support chain that is uniform and has no discontinuity.

The measurement system 1 comprises, in succession, the power supply and acquisition unit 3, one or more measurement devices 2'-2''' and an end device 4. The support 5 of the end device 4 can take the same form as that of a measurement device 2 except for the free face 5f. In effect, since the end device 4 is the measurement device placed at the end of a chain of measurement devices 2 of a system 1, one of the faces of the end device 4 is not attached to another measurement device and remains free. It has a decreasing thickness to form, with the outer wall against which the device 4 is applied, a profile that is as aerodynamic as possible. The end device 4 comprises end-of-line impedances making it possible to ensure the termination of the electrical line produced by the succession of measurement devices.

Figure 4:
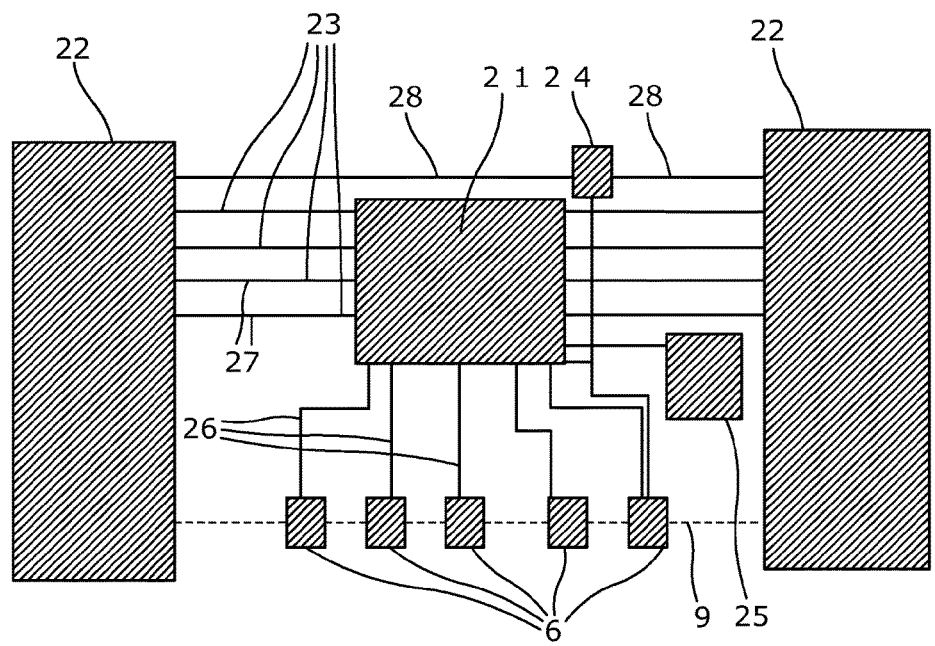
FIG. 4 represents a simplified schematic view of the organization of certain electronic components and of certain links between said components according to an embodiment of the measurement device according to the present invention; for simplification purposes, all of the components and links are not represented.
Figure 5:
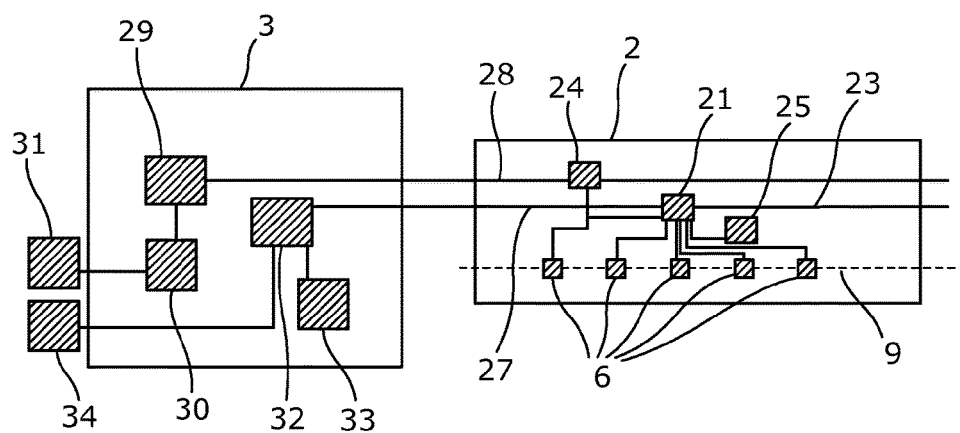
FIG. 5 represents a simplified schematic view of the organization of certain electronic components and of certain links between said components of the overall measurement system comprising the measurement device according to an embodiment of the present invention; for simplification purposes, all of the components and links are not represented.

The support 5 can receive a plurality of sensors 6. In the embodiment illustrated in FIG. 2, the sensors 6 are distributed uniformly or not over all or part of the length of the support 5. According to an embodiment of the invention, the sensors 6 are distributed uniformly. Each sensor 6 is separated from the neighboring sensor by a distance that avoids any interference in their operation. As represented in FIGS. 4 and 5, the sensors 6 are for example arranged on a same line 9 parallel to the longitudinal direction of the support 5. The sensors could be arranged according to another arrangement and, for example, on a number of mutually parallel lines.

As illustrated in FIGS. 1 and 2, the support 5 has a cavity 8 produced in the face 5a intended to be in contact with the wall of the aircraft. The cavity 8 receives a flexible printed circuit 10 (commonly referred to as flex PCB, for printed circuit board, or even flex circuit). The cavity 8 takes a form that corresponds to that of the circuit 10 and closely follows the forms of this circuit. In the example illustrated, the circuit 10 has a longilinear form suited to that of the support 5. The circuit could take any other type of form. In the measurement devices 2 apart from the end device 4, the circuit 10 leads to each side of the support 5 to allow the connection on one hand with the central power supply and acquisition unit 3 or another measurement device 2 and, on the other hand, with another measurement device 2 or the end device 4 as seen above. The circuit 10 and the support 5 follow a same longitudinal direction. The thickness of the cavity 8 is such that the free surface of the circuit 10 is flush with the surface of the support 5 intended to come into contact with the wall of the aircraft. In this way, the support 5 and the circuit 10 forms a same smooth and flexible surface that makes it possible to best adhere to the profile of the zone of the aircraft onto which said surface is intended to be attached. According to an embodiment illustrated in FIG. 1, the circuit 10 that can be seen by transparency or in detail in the enlarged simplified longitudinal cross-sectional view for the device 2", extends by a certain distance D beyond the end 5f of the support 5: a part of the circuit 10 is therefore located outside of the support 5 without contact therewith. The other end of the circuit 10 is offset by a certain distance and for example by the same distance D from the other end 5e of the support; FIG. 1 shows it for the adjacent device 2'. In this way, the measurement devices 2 can be fitted into one another, the end of the circuit 10 being located outside of the support 5 of the device 2" that is inserted into the space left free by the offset of the circuit 10 located in the support 5 of the neighboring device 2'. The distances D of the offset at one end and at the other of the support 5 can be identical or different.

According to a first embodiment of the invention, that illustrated in FIG. 2, the support 5 has recesses 11 for the sensors 6, the form of each of these recesses corresponding to that of the sensors 6 housed therein. Each recess 11 closely follows the contours of the sensor 6 which is intended for it. Each recess 11 leads to the outside of the support, namely to the face 5b of the support 5. Each recess 11 also leads to the cavity 8 to allow the sensor 6 to be connected with the circuit 10 and, in the embodiment illustrated, be soldered to the circuit 10. The height of the recess 11 is such that the sensor 6 is not in contact with the film 12.

The recess 11 is closed by a film 12. The film 12, of a single piece, covers all the recesses 11 of the measurement device 2. According to the embodiment illustrated in FIG. 2, the film 12 has dimensions such that it covers all the surface of the face 5b of the support in the transverse direction. According to another embodiment, the film 12 extends over only a part of the surface of the face 5b in the transverse direction. The width of the film 12 must be less than or equal to the width of the face 5b of the support. As represented in a simplified manner in FIG. 1 for the measurement device 2", in the longitudinal direction of the support, at the end 5f, the film 12 extends by a certain distance D beyond the end 5f of the support 5: a part of the film 12 is therefore located outside of the support 12 without contact therewith. The other end of the film 12 is offset by a certain distance and, for example, by the same distance D from the other end 5e of the support; FIG. 1 shows it for the support 5 of the adjacent device 2'. In this way, the measurement devices can be fitted into one another, the end of the film 12 located outside of the support 5 coming to rest on the surface left free by the offset of the film 12 located on the support 5 of the neighboring device 2'. The distances D of the offset at one end and at the other end of the support 5 can be identical or different. In effect, the end device 4 comprises no specific film 12. It is covered by the film 12 which extends beyond the adjacent measurement device 2. It may therefore be necessary to have a longer length of film 12 on a measurement device 2 adjacent to the end device 4. The same applies for the circuit 10 as seen above. According to a particular embodiment, the film 12, the support 5 and the circuit 10 has an identical length and the distance D for the film and the circuit is identical. These distances could be different. In the example illustrated, the film 12 has a parallelepipedal longilinear form. The width of the film 12 is identical to the width of the free face 5b of the support. The film 12 can, as seen above, have a smaller width.

The thickness of the film depends on the material adopted. The material and the thickness of the film must be such that the film is flexible enough to follow the contours of the airplane. It may for example take the form of a metallic or polyurethane foil with a thickness of between 0.01 and 0.5 millimeter and, in the example illustrated, 0.05 millimeter. The film 12 is incorporated in the form of the support 5. In the case of a metallic foil, it presents no irregularity, no relief likely to disrupt the flow of air. The film 12 is fixed to the support 5 by a specific glue, by a double-sided adhesive film or by any other means. The fixing means is chosen so as to air-gap the link between the support 5 and the film 12: because of that, the air cannot pass from one recess 11 to another. The recesses 11 are air-gapped from one another by the fixing means introduced between the support 5 and the film 12. Furthermore, the fixing means can for example be the acrylic adhesive transfer tape from the company 3M. According to a particular embodiment, a tape of reference 9460PC and of thickness 0.05 millimeter or even of reference 9469PC and of thickness 0.13 millimeter is chosen. In the embodiment illustrated, the film 12 rests on the support 5. It could be incorporated in many other ways while retaining the most aerodynamic profile possible. Thus, for example, in the same way as for the circuit 10, a cavity could be provided in the support 5 into which the film 12 is inserted so that the free surface of the film 12 is flush with that of the support 5. According to another embodiment, the film 12, of a single piece, could cover all the measurement devices of a chain of devices of a system. In this latter case, it is also then possible to provide a single, unique support 5 of very long length for the measurement device.

As illustrated in FIG. 2, the film 12 has at least one orifice 13 directly in line with each sensor 6 ensuring the pressure tapping necessary to certain types of sensors and allowing an air passage between the flow of air outside the device 2 located in the vicinity of the wall onto which it is attached and the sensor. In effect, some sensors, such as the pressure sensor for example, require openings to the flow of air allowing them to pick up the pressure difference generated by the flow. These openings constitute pressure taps. The orifices 13 are distributed over the film 12 in the same way as the sensors 6 so that each sensor has at least one pressure tap correctly positioned and, for example, in line therewith to allow it to perform its measurements.

The film 12 provides the measurement device 2 with an aerodynamic form; it must also ensure the seal-tightness of the sensors without the need to add seals. To do this, in the case where pressure taps are provided on the film 12, each of the orifices 13 must have a size such that the orifice allows air to pass while remaining tight to the fluids likely to be present in the environment of said device and to damage it. For example, in the application illustrated, the orifice has dimensions making it possible to make the film 12 tight to the water that might originate from bad weather and/or to a mixture of water and drops of fuel that might rest on the measurement device. In the example illustrated in FIG. 1, the orifices 13 are of circular form and have, for example, a diameter of 0.2 millimeters.

Figure 6:
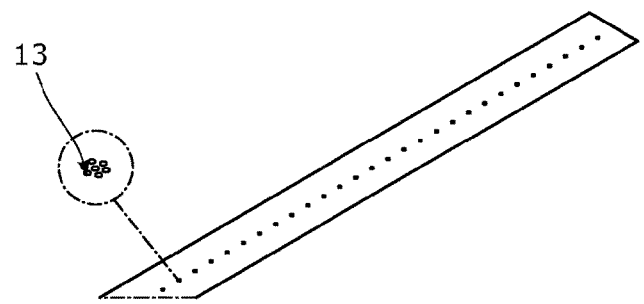
FIG. 6 represents a schematic view of a film of a measurement device according to the present invention showing an enlargement of the orifices produced in said film.

In another embodiment of the invention, the film is pierced by a plurality of orifices 13 in line with each of the sensors 6. According to an example illustrated in FIG. 6, there are 7 of the orifices 13 with a diameter, for example, of 0.2 millimeter. Six of the seven orifices are distributed uniformly in a circle for example of 0.6 millimeter diameter, the seventh orifice being located at the center of this circle.

In the case where the film 12 adheres to the support 5 via a double-sided adhesive film, the adhesive film is perforated so as to have orifices located to correspond with the pressure taps such that the adhesive film does not block the orifices 13 of the film 12.

As will be seen later, other electronic components can be soldered to the circuit 10. Some of these components may protrude from the surface of the circuit 10 in the same way as the sensor 6. In this case, other recesses are provided in the support 5 to house these components in the support 5 and prevent it from being deformed. FIG. 2 illustrates an example of another electronic component extending beyond the surface of the circuit for which another recess 11bis is provided in the support 5. The recess 11bis can lead to the outside of the support 5 (as shown by transparency in FIG. 1) or not (like the recess 11bis of FIG. 2) according to the height of the electronic component. In the case of emergent recesses 11bis, the recess is filled with glue to ensure a continuity with the surface 5b and offer a surface 5b that is as smooth as possible so as not to disrupt the outside flow. According to an embodiment of the invention, the film 12 also covers the recesses 11bis. In this embodiment the recesses 11bis are also filled with glue so as not to have captive air which could deform the film 12. Furthermore, as seen above, the glue ensures a continuity on the surface 5b which simplifies and improves the fixing of the film 12.

According to one embodiment of the invention, the different components of the measurement device are assembled as follows:

The sensors 6 are fixed, in the example illustrated soldered, onto the circuit 10. The assembly formed by the circuit 10 and the sensors 6 is then fixed by any known kind of means to the support 5, the circuit 10 and the sensors 6 as well as the other electronic components mentioned above being housed in the cavities 8 and recesses 11, 11bis provided for that purpose. The circuit 10 is fixed to the support 5 by a specific glue, by a double-sided adhesive film or by any other means. The fixing means is chosen so as to air-gap the link between the support 5 and the circuit 10: because of that, air cannot pass from one recess 11 to another.

Figure 7:
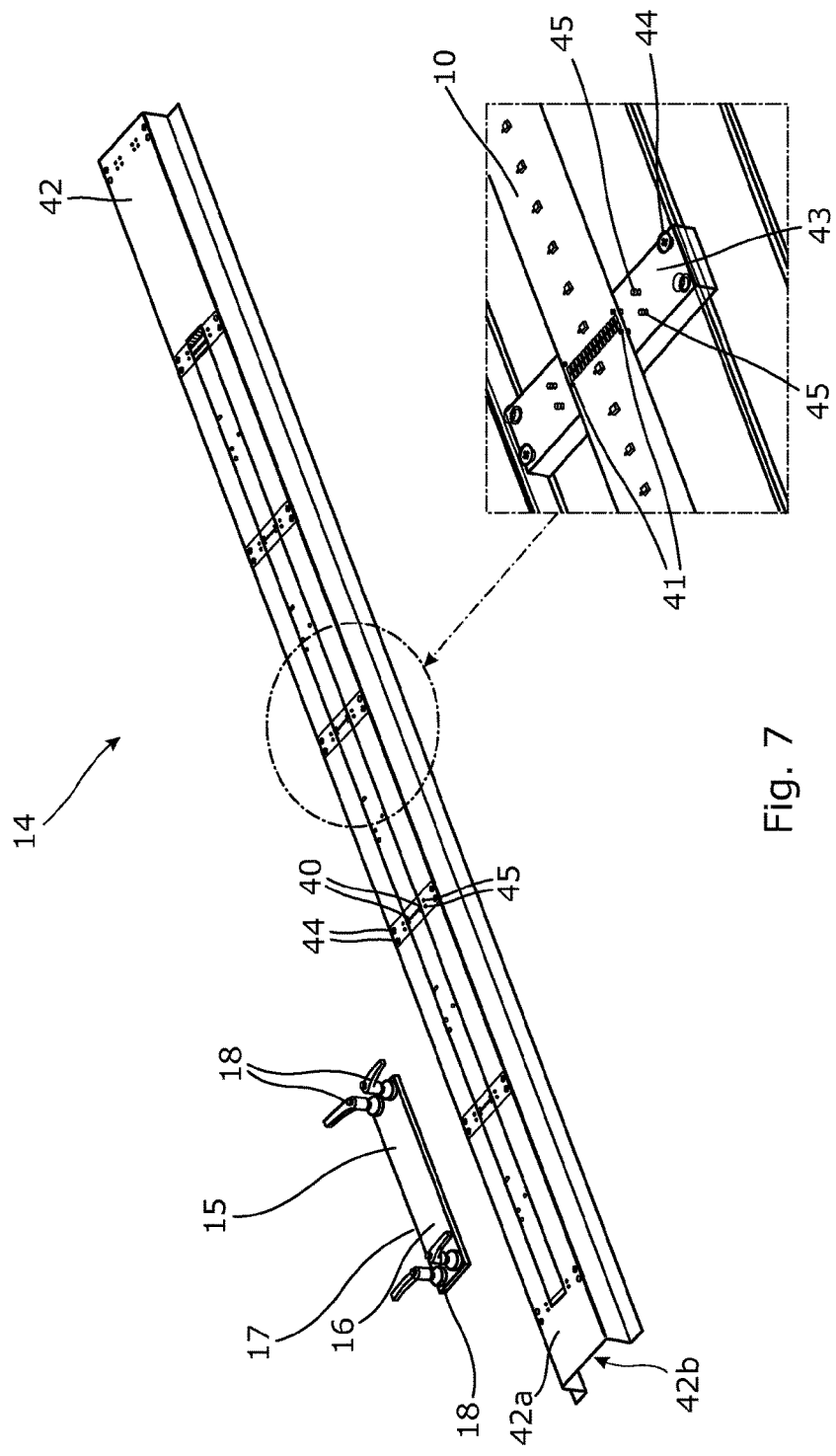
FIG. 7 represents a perspective simplified schematic view of tooling used for the assembly of the measurement device in which a perspective simplified enlarged view shows a part of the measurement device being assembled.

According to an exemplary embodiment illustrated in FIG. 7, the circuit 10 comprises, at each of its ends, positioning markers also forming fixing means in the form of openings 40 making it possible to receive removable fixing means 41 in the form of tenons that make it possible to fix said circuit onto a support surface 42. The support surface 42 as shown in FIG. 7 has a form such that it maintains a space between the support surface 42 of the circuit 10 and the floor on which it is placed. In the example illustrated, the support surface 42 has a cap or omega form. Because of this, it has an outer surface 42a and an inner surface 42b. Holes are provided on this support surface to make it possible for the fixing means 41 in the form of tenons to pass therethrough. In the example illustrated, a block 43 with integrated tenons 41 is fixed to the inner surface 42b, the tenons 41 of the block 43 passing through the holes provided on the support surface 42. The block 43 is fixed to the support surface by any known kind of means and for example means of the screw/nut 44 type. The tenons 41 of the block 43 allow for the positioning and the fixing of the circuit 10 as shown in FIG. 1. The circuit 10 is positioned on the support surface using the tenons 41 of the block 43 onto which the openings 40 of the circuit 10 are placed. The next step comprises the positioning of the support 5 on the circuit 10. The support 5 comprises positioning markers also forming fixing means for fixing the support 5 onto the circuit 10 in the form of openings not represented that are formed in the support 5. The tenons 41 of the block 43 are placed in such a way as to be located in line with said openings. Thus, to glue the circuit 10 into the support 5, it is sufficient to place the openings provided on the support 5 in line with the tenons 41 then to insert the tenons therein. The circuit 10 is thus correctly positioned relative to the support 5.

According to a particular embodiment, the placing of the film 12 on the support 5 with which the circuit 10 is associated is done using a tool 14 represented in FIG. 7. The tool 14 comprises a plate 15 having two faces, a handling face 16 and a working face 17. The handling face 16 is provided with at least one handle 18 making it possible to hold and manipulate the plate 15. In the example illustrated, the handle takes the form of four arms 18 arranged at each corner of the plate 15. Each of these arms 18 is bent to facilitate the handling of the tool. The plate 15 preferably has a size at least equal to that of the film 12. At the four corners of the working face 17 of the plate 15 there are tenons that are not represented. The film 12 comprises positioning markers forming means for fixing the film onto the support 5 in the form of holes that are not represented. The tenons are positioned in such a way as to pass through the holes provided in the film 12 and also holes provided in the support 5. The tenons of the tool 14 are engaged in the holes provided on the film 12 and of a size such that the film 12 remains attached to the tool 14 while it is being manipulated. The film 12 is then coated with a glue, a double-sided adhesive film or any other fixing means. The tool is positioned above the support 5 so as to engage the tenons in the openings provided in the support 5. Once the film 12 rests on the support 5 and adheres thereto, the tool is removed. In this way, the film 12 is correctly placed on the support 5: the orifices 13 are located in line with the sensors 6 and the film 12 does not extend transversely beyond the surface 5b.

With the fixing means forming markers on the support surface, the film, the support and the tool can take any other known form that makes it possible to ensure the positioning and the fixing of the elements with respect to one another.

The film 12 makes it possible to offer a free surface that is as smooth as possible exhibiting a very low roughness with no irregularity. It makes it possible to ensure the tightness of the sensors and the air-gapping between all the sensors of the support.

The sensors 6 are enclosed by the walls of the support 5, of the circuit 10 and of the film 12.

According to a second embodiment illustrated in FIG. 2, only the form of the film 12 differs; apart from the film 12, the measurement device has all the characteristics described for the first embodiment. In the second embodiment, the film 12 is incorporated in the support 5. The film 12 and the support 5 form one and the same part. Since the film 12 is no longer distinguished from the support 5, it forms a part thereof. Everything regarding the orifices formed on the film 12 is valid for an incorporated film. Because of this, the integrated part of the support 5 forming the film 12 is designated by the term film 12.

Whatever the embodiment, for a film 12, whether integrated or not in the support 5, it may be that condensation forms in the recess 11 because of the presence of the orifices 13.

Thus, in order to secure the complete seal-tightness of the sensors, it is possible to insert a membrane 20 between the film 12 and the sensor 6. The membrane 20 is produced in a material that allows air to pass for the sensors that require a pressure tap and that is water-tight. The membrane can be produced for example in Gore-Tex (registered trade mark) material. The membrane 20 can be introduced into each recess 11 and have the same dimensions as the latter. In order to ensure the seal-tightness of the sensors, the entire periphery of the surface of the membrane 20 facing the sensor 6 is glued to the sensor 6 and/or the entire periphery of the surface of the membrane 20 facing the film 12 is glued to the film 12. The membrane 20 can assume other embodiments such as, for example, the form of a strip making it possible to cover all the sensors 6 and, for example, the form of a rectangular strip of a width identical to that of the recess 11 and long enough to cover all the recesses 11. The membrane 20 can for example have the same length as the support 5. A space is then produced in the support 5 for the passage of the strip from one recess 11 to another. To ensure the air-gapping between the sensors, the entire surface of the two opposite faces of the strip are glued to the support 5 in the space created.

The flexible printed circuit 10, illustrated in FIG. 4, produces the connection ensuring the power supply and the flow of data notably between the sensors 6, control means 21 for these sensors 6, the ends 22 of the circuit 10 at which the connections to the central power supply and acquisition unit 3 and/or to other measurement devices are located.

As FIGS. 4 and 5 show, tracks 23 are provided in the circuit 10. The tracks 23 run right across the circuit 10. The tracks 23 extend between the ends of the support 5 for the link to the central acquisition unit and/or to other measurement devices.

The circuit 10 comprises accommodating lands onto which the electronic components such as the sensors, the control means 21 or the like are soldered. Only the essential electronic components are represented. Other secondary electronic components such as, for example, voltage regulator circuits 24, memories 25 such as, for example, EEPROM memories, are integrated in or connected to the circuit 10.

The control means 21 consist, in the present invention, of a single FPGA (field-programmable gate array) integrated circuit. A single integrated circuit 21 is provided for each measurement device 2. Contrary to the prior art in which each sensor had a specific electronic circuit, the present invention provides a single control circuit 21 thus offering many advantages: a lighter weight, a lower consumption, less complex data communication, a less bulky system, a limitation of the points of rigidity in a curved zone because of its small surface for increased longevity. The FPGA integrated circuit 21 controls all the sensors, recovers the data from the latter and sends them via the tracks 23 to the central acquisition unit or to another measurement device. The integrated circuit 21 is directly connected to the tracks 23. According to one embodiment, the integrated circuit 21 is located on the path of the tracks 23. Given the number of connections necessary to the different components of the measurement device and in particular to the different sensors 6, the circuit 10 comprises a number of printed circuit layers separated by insulating layers. On each printed circuit layer, tracks 23 are provided. The integrated circuit 21 is connected to tracks 23 of the different layers.

The sensors 6 are distributed over the circuit 10 and in one possible embodiment, offset away from the tracks 23. Accommodation lands are provided offering connection points to which the electrical connection points of the sensors are soldered. Tracks 26 link said connection points of the sensor 6 to the integrated circuit 21. The tracks 26 can also be located on different layers of the printed circuit.

The FPGA integrated circuit 21 is connected to an EEPROM memory 25 to store the data necessary to the operation of the measurement device 2 and notably, for example, calibration data such as temperature compensation coefficients of the sensors 6.

The tracks 23 comprise tracks 27 allowing communication of the data and a track 28 making it possible to supply power to the electronic components of the measurement device. The circuit 21 is connected to the tracks 27. The circuit 21 and the sensors 6 are connected to the track 28 via a voltage regulator 24. According to one embodiment of the invention, to add two measurement devices or one measurement device with the central power supply and acquisition unit, the faces 5e, 5f of the support 5 are glued together and the tracks 23 are joined by soldering: lands are provided at the ends 22 and more specifically one land per track 23.

FIG. 5 shows a simplified diagram according to an embodiment of the invention of certain components and of certain essential electrical links between a central power supply and acquisition unit 3 and a measurement device 2.

The central power supply and acquisition unit 3 comprises means 29 for supplying power to all the measurement devices via the track 28. The circuits 21 and sensors 6 are connected to said means 29 via the voltage regulator 24 being connected with the track 28. The unit 3 also comprises at least one converter 30 making it possible to modify the power supply from an external source 31, in the application illustrated, originating from the aircraft and making it possible to adapt it to the power supply required for the components of the unit 3 and the measurement devices 2. The unit 3 also comprises central control means 32 for all the circuits 21; the means 32 can take the form of an FPGA circuit. The means 32 have a memory 33 such as an EEPROM memory to store the data necessary to its operation. The means 32 notably receive the measurements performed by the measurement devices and forward them to a data collection and/or processing unit 34 that can, in the example illustrated, be located inside or outside the aircraft, or on the ground.

No control means is provided in the end device 4. In effect, as seen above, the circuit 10 extends beyond the support 5 of the measurement device 2. The circuit of the measurement device 2 adjacent to the end device 4 is therefore inserted into the support 5 of the end device. The measurements performed by the sensors of the device 4 are in fact those performed by the adjacent measurement device 2.

The present invention is not limited to the aeronautical field. The measurement device according to the present invention could be used in many other technical fields and, for example, in the field of space, air, land or sea craft. It can also be used on a fixed object placed in a flow of air such as, for example, a part of a vehicle being tested in a wind tunnel. It can also be used to characterize a wind tunnel by attaching the measurement device to one or more walls thereof.

The invention claimed is:

1. A measurement device comprising:
   a support having a first surface, a second surface opposite the first surface, a first longitudinal end, and a second longitudinal end;
   a plurality of recesses defined in the support and provided with openings leading toward the outside at the first surface;
   sensors provided in the recesses; and
   a flexible printed circuit for the sensors, the flexible printed circuit having a first longitudinal end and a second longitudinal end, the first longitudinal end of the flexible printed circuit extending beyond the first longitudinal end of the support and the second longitudinal end of the flexible printed circuit being offset from the second longitudinal end of the support, wherein the support comprises a cavity in which the flexible printed circuit is housed, the cavity being defined in the second surface such that the flexible printed circuit has an exposed surface flush with the second surface of the support, wherein the first flexible printed circuit is configured to connect to at least one second measurement device at the first longitudinal end, and wherein the support is configured to receive a portion of a second flexible printed circuit of a second measurement device at the second longitudinal end.

2. The measurement device as claimed in claim 1, wherein the flexible printed circuit is crossed by a first plurality of tracks joining linking ends of the circuit.

3. The measurement device as claimed in claim 2, wherein the sensors are positioned on a same row or a number of rows offset relative to the first plurality of tracks.

4. The measurement device as claimed in claim 2, further comprising a second plurality of tracks for linking each of the sensors to a control circuit.

5. The measurement device as claimed in claim 2, wherein one of the first plurality of tracks is reserved for supplying power to the sensors.

6. The measurement device as claimed in claim 1, wherein the circuit comprises at least two printed circuit layer separated by an insulating layer.

7. The measurement device as claimed in claim 6, wherein the first and second plurality of tracks and are located on one or other of the flexible printed circuit layers.

8. The measurement device as claimed in claim 1, wherein the support is a flexible support configured to follow a contour of a wall.

9. A measurement system comprising at least one measurement device comprising:

a support having recesses provided with openings leading toward the outside and a first longitudinal end and a second longitudinal;

sensors provided in the recesses; and a first flexible printed circuit for the sensors, the first flexible printed circuit having a first longitudinal end and a second longitudinal end, the first longitudinal end of the first flexible printed circuit extending beyond the first longitudinal end of the support and the second longitudinal end of the first flexible printed circuit being offset from the second longitudinal end of the support;

wherein the support comprises a cavity in which the flexible printed circuit is housed, wherein the first flexible printed circuit is configured to connect to at least one second measurement device at the first longitudinal end, and wherein the support is configured to receive a portion of a second flexible printed circuit of a second measurement device at the second longitudinal end.

10. The measurement system as claimed in claim 9, further comprising means for supplying power to all the measurement devices via a track of the circuit.

11. The measurement system as claimed in claim 9, wherein the flexible printed circuit is crossed by a first plurality of tracks joining linking ends of the circuit.

12. The measurement system as claimed in claim 11, wherein the sensors are positioned on a same row or a number of rows offset relative to the first plurality of tracks.

13. The measurement system as claimed in claim 11, further comprising a second plurality of tracks for linking each of the sensors to a control circuit.

14. The measurement system as claimed in claim 11, wherein one of the first plurality of tracks is reserved for supplying power to the sensors.

15. The measurement system as claimed in claim 9, wherein the circuit comprises at least two printed circuit layer separated by an insulating layer.

16. The measurement system as claimed in claim 15, wherein the first and second plurality of tracks and are located on one or other of the flexible printed circuit layers.

* * * * *